(12) United States Patent
Heuermann et al.

(10) Patent No.: US 7,831,219 B2
(45) Date of Patent: Nov. 9, 2010

(54) MATCHING NETWORK

(75) Inventors: Holger Heuermann, Stolberg (DE); Arash Sadeghfam, Wuerselen (DE)

(73) Assignee: Infineon Technologies AG, Munich (DE)

( * ) Notice: Subject to any disclaimer, the term of this patent is extended or adjusted under 35 U.S.C. 154(b) by 850 days.

(21) Appl. No.: 11/636,383

(22) Filed: Dec. 8, 2006

(65) Prior Publication Data

US 2007/0155347 A1 Jul. 5, 2007

(30) Foreign Application Priority Data

Dec. 9, 2005 (DE) .................. 10 2005 058 875

(51) Int. Cl.
*H03C 1/52* (2006.01)
(52) U.S. Cl. .................. 455/107; 455/125; 455/193.1; 455/282; 333/17.3; 327/74
(58) Field of Classification Search .................. 455/107, 455/120, 121, 124, 125, 129, 170, 178.1, 455/191.1, 193.1, 281, 282; 333/17.1, 17.3, 333/124; 327/74, 77
See application file for complete search history.

(56) References Cited

U.S. PATENT DOCUMENTS

| | | | |
|---|---|---|---|
| 5,557,221 A * | 9/1996 | Taguchi et al. .................. 327/53 |
| 2004/0185916 A1 | 9/2004 | Chang et al. |
| 2004/0251948 A1 | 12/2004 | Lee et al. |

FOREIGN PATENT DOCUMENTS

| | | |
|---|---|---|
| DE | 10 2004054442 | 5/2006 |
| EP | 1 564 896 A1 | 2/2004 |
| JP | 01318310 A | 12/1989 |
| WO | 03059024 A2 | 7/2003 |
| WO | WO2005/008908 A1 | 1/2005 |
| WO | WO 2006/050701 A3 | 5/2006 |

OTHER PUBLICATIONS

Sjöblom, Peter and Henrikk Sjöland. "An Adaptive Impedance Tuning CMOS Circuit for ISM 2.4-GHz Band." *IEEE Transactions on Circuit and Systems*. vol. 52, No. 6. Jun. 2005. p. 1115-1124. (10 Pages).

* cited by examiner

*Primary Examiner*—Nhan Le
(74) *Attorney, Agent, or Firm*—Maginot, Moore & Beck (57) ABSTRACT

A matching network for matching an antenna to a transmitter or receiver comprises an input port for receiving high-frequency power, an output port and a switchable impedance transformation circuit, which is connected between the input port and the output port. The impedance transformation circuit comprises a CMOS switch in a high-frequency path, which has a first switching state and a second switching state. The impedance transformation circuit is implemented to match a first impedance applied to the output port to a first predetermined impedance in the first switching state, and to match a second impedance applied to the output port to a second predetermined impedance in the second switching state. The inventive matching network allows a particularly good utilization of power provided by a transmitting amplifier or an antenna.

16 Claims, 7 Drawing Sheets

MATCHING NETWORK

CROSS-REFERENCE TO RELATED APPLICATION

This application claims priority from German Patent Application No. 102005058875.1, which was filed on Dec. 9, 2005 and is incorporated herein by reference in its entirety.

BACKGROUND OF THE INVENTION

1. Field of the Invention

The present invention relates generally to a matching network for matching an antenna to a transmitter or receiver, and particularly to a dynamic matching network for multi-band antennas.

2. Description of the Related Art

Wireless communication units are nowadays used in a plurality of applications, to allow communication between a wireless means and a stationary means or also between several wireless means.

One of the most important characteristics of modern wireless communication units is their operating time, which is divided into the so-called "talk time" and the so-called "stand time". The mentioned characteristics are influenced by antenna matching in a front end or high-frequency part, respectively. Bad antenna matching has the effect that reflections occur at the output of a power amplifier before the antenna. The reflections can also be considered as losses and reduce the (effective) transmitting power of the unit.

Larger changes of the environmental conditions of the antenna have the effect that the antenna impedance deviates from a static optimum value or a design value, respectively. Frequently, a deviation of the antenna impedance from a set value or a static optimum value, respectively, is already caused by covering the antenna with a hand. The loss of (effective) transmitting power resulting thereby has to be compensated, for example in GSM systems, by an increase of transmitting power to avoid reduction of the range. In highly linear systems, such as UMTS, the connection is even frequently interrupted due to the erroneous matching, in the above-mentioned case.

The linearity of the system depends also on antenna matching. Reflections at the antenna overlay the supply voltage of the output amplifier and cause an offset of the operating point. Thereby, a dependence of the amplification on environmental antenna reflections results, which is reflected in a decrease of the so-called eye diagram of the digital message signal or in an increase of the bit error rate, respectively.

Figure 8:
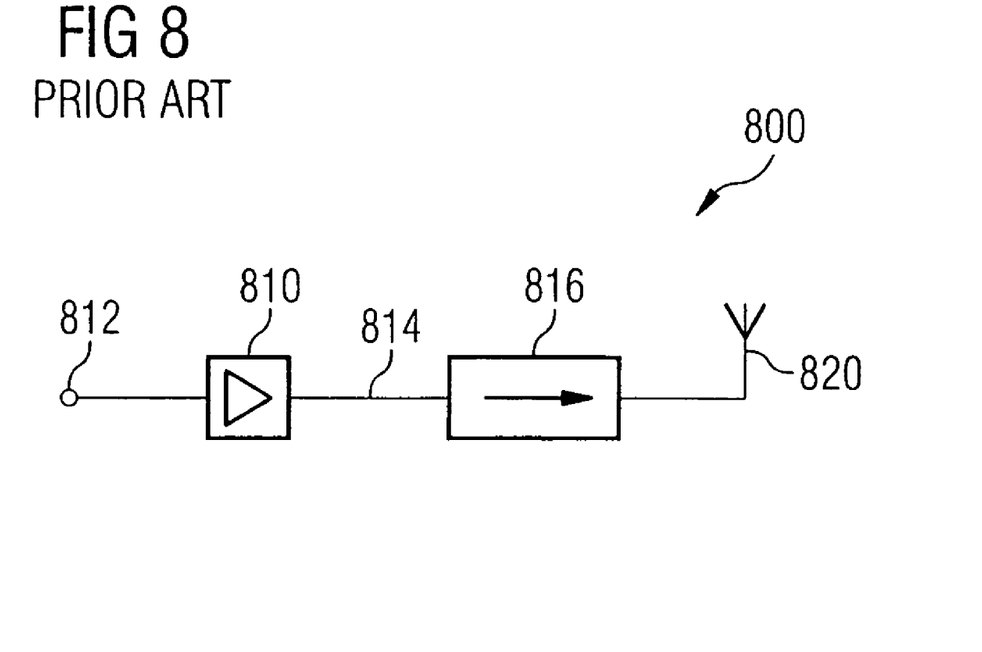
FIG. 8 is a block diagram of a high-frequency transmitting front end according to the prior art.

In order to effect decoupling of the output amplifier from the antenna impedance and thus to generate immunity of output matching against environmental mismatches, an isolator can be used between the output amplifier and the antenna. Thus, FIG. 8 shows an output circuit of a communication unit according to the prior art. The output circuit is designated by 800 in its entirety. An amplifier or power amplifier 810, respectively, receives a high-frequency input signal 812 and amplifies the high-frequency input signal 812. Then, the amplifier 810 provides the amplified high-frequency signal 814 to an isolator 816. The isolator passes the amplified high-frequency signal 814 and provides the same to an antenna 820. Further, the isolator 816 attenuates the high-frequency power, which is reflected by the antenna 820, so that only a low measure of reflected power is applied at the output of the amplifier 810. Thus, the amplifier 810 is decoupled from reflections occurring at the antenna 820, to a certain amount, in dependence on the isolation characteristics of the isolator 816. As a result, the amplifier 810 can operate, for example in an operating range, which is as linear as possible. Power reflected at the antenna 820 is dissipated at least partly in the isolator 816. The antenna circuit of FIG. 8, consisting of an output amplifier and an isolator allows thus at least partly decoupling of the amplifier 810 from the antenna characteristics.

Isolators are basically used in SMD technique (SMD=surface mounted devices) with a size of generally more than 0805 (L×W×H=length×width×height: 2 mm×1.25 mm=1.35 mm). Thus, the isolators in SMD technique form a concentrated component. Compared to integrated components or common SMD devices of packet size 0201 (L×W×H=length ×width×height: 0.5 mm×0.25 mm×0.3 mm), a series of disadvantages is accepted with isolators. Thus, isolators have typically comparatively large space requirements, wherein particularly the additional height of approximately one millimeter has a spurious effect. Further, the isolators have additional weight and cause transmission losses. In addition to the above-mentioned disadvantages, in isolators, there are further two other disadvantages of ferritic components, namely the comparatively high cost and the harmonics caused by their non-linear behavior.

Contrary to older wireless communication units, modern systems are frequently multiband-capable. Almost all commercially available mobiles are, for example, implemented for at least two frequencies (dual-band operation). However, there are mainly devices or units, respectively, on the market, which allow operation in three frequency bands (triple-band operation). Additionally, many devices include a bluetooth interface. Basically, a matched antenna has to be provided for each of the used frequency bands. Thus, additional switching networks are required to direct the transmission power to the correct antenna. These switching networks cause additional losses reducing the operating time of the system.

Further, dual-band antennas are available, which offer matching for two frequencies (e.g. for GSM 900 and GSM 1800). Thus, the number of required antennas is lower than the number of operating frequency bands.

US-2004/0185916 A1 describes a high-frequency amplifier tolerant towards load variations. The usage of a "load-variant" amplifier offers the possibility to replace an isolator. According to the mentioned reference, an amplifier arrangement is used, which is very similar to a balanced amplifier arrangement. An input network divides an input signal and generates a phase difference of 90 degrees between two amplifiers connected in parallel. An output network compensates this phase difference and combines the power of the two amplifiers. Thereby, it is ensured that the amplifiers are coupled to a load at an output of the amplifier, once inductively and once capacitively. Variations of the load impedance are thus largely compensated for at least one of the amplifiers.

With regard to compensation of mismatchings at the antenna, the described load-variant amplifier for omitting the isolator can be compared to an ideal isolator with decoupling of 6 dB in the ideal case. Further, space and cost savings resulting by omitting the isolator, are largely eliminated by the usage of the required coupling and matching networks. Further, the above-described circuitry of a load-variant amplifier represents a solution for a single fixed frequency band.

The German patent application with the application number DE 10 2004 054442 entitled "Antennenarchitektur und Koppler" describes a so-called "ISO antenna". The ISO antenna represents an arrangement for saving an isolator. The mentioned approach follows also a balanced amplifier arrangement. A coupling network divides an input power between two output ports, wherein the two paths have a phase difference of 90 degrees. Two antennas with identical radiation characteristics are deposited or disposed, respectively, at the output ports close to each other. A fourth port of the coupling network is terminated with a terminating resistor (having the system impedance) in a reflection-free way. Similar to an input port of a balanced amplifier arrangement, the two powers reflected at the antennas overlay with a phase difference of 180 degrees and cancel each other. Further, in the shown approach, two frequency bands can be matched simultaneously.

In comparison to the concept illustrated in US-2004/0185916 A1, the described ISO antenna provides better isolation and can be matched for two frequencies. In contrast to the approach shown in US-2004/0185916 A1, the high system requirements are shifted to the antenna level when using the ISO antenna. Thus, a second antenna with identical radiation characteristics is required, which has to be disposed close to the first antenna. By using an additional antenna, there is no effective space saving. Further, by using an ISO antenna, merely two fixed frequency bands can be matched. A further disadvantage when using an ISO antenna is that in mismatching of the antenna, the transmitting power is provided to the resistor at the fourth port of the coupling network. There, the transmitting power reflected by the antennas is converted into heat as ohmic loss. Thus, in mismatching of the antennas, the effective transmitting power is heavily reduced.

In summary, it can be said that two problems occur according to the prior art. A weakness of known antennas is their sensitivity against environmental influences. Environmental mismatchings, for example caused by larger well-conducting areas, are passed on directly to the next stages, for example an amplifier, and cannot be compensated. Correspondingly, non-linearities are forced upon the output amplifier by mismatching, or the amplifier is brought to an operating point by the transmitting power reflected by the mismatched antenna, respectively, where linear operation is no longer ensured. Further, the reflected power, which is proportional to the antenna mismatching, has to be compensated by higher power consumption. In other words, if power is reflected by a non-matched antenna, the reflected power is not radiated. In order to obtain radiated power sufficient for reception, the transmitting power generated by the transmitting amplifier has to be increased, which results in an increase of the supply power consumed by the transmitting amplifier. In the case of mismatching of the antennas, the mentioned connection results in a shorter operating runtime.

In summary, it can be said that the isolators conventionally used for decoupling the output amplifier from environmental antenna mismatchings cause relative high costs and increase the weight of the system. The transmission losses caused by the isolators have an adverse effect on the operating time of accumulators supplying a mobile communication unit.

Further mismatchings result in transmitter and receiver using a single antenna for several frequency bands. Multiband transmitters and receivers, such as mobiles or personal digital assistants (PDA) use several antennas, to be well matched for the respectively used frequency range, for example GSM 900, GMS 1800, UMTS and/or bluetooth. Since every antenna causes additional weight and cost and contributes to the overall size of the unit, frequently, dual-band antennas are used. In other words, the usage of dual-band antennas, which are matched both at 900 MHz and at 1800 MHz, represents an approach for obtaining a reduced number of antennas. However, dual functionality of an antenna is generally paid for on the expense of matching of the dual-band antenna decreased compared to single-band antennas in the individual operating frequencies.

Thus, when using dual-band antennas or multi-band antennas, there is typically worse matching than when using a single-band antenna.

SUMMARY OF THE INVENTION

It is an object of the present invention to provide an apparatus, which allows particularly efficient usage of available high-frequency power in connection with a transmitter and/or a receiver.

The present invention provides a matching network for matching an antenna to a transmitter or receiver, having: an input port for receiving high-frequency power; an output port; a switchable impedance transformation circuit connected between the input port and the output port, wherein the impedance transformation circuit has a CMOS switch in a high-frequency path having a first switching state and a second switching state, and wherein the impedance transformation circuit is implemented to match a first impedance applied to the output port to a first predetermined impedance in the first switching state, and to match a second impedance applied to the output port to a second predetermined impedance in the second switching state.

Thus, it is the central idea of at least some embodiments of the present invention to determine for which of at least two possible impedances applied to the output port matching exists, through a CMOS switch lying in the high-frequency path in dependence on a switching state of the CMOS switch. Here, it has been shown that a matching network comprising a CMOS switch in the high-frequency path fulfills the requirements occurring in current applications particularly well. Thus, the matching network allows matching of an antenna under varying environmental conditions, wherein matching of the antenna can be quickly adapted to varying environmental conditions by changing the switching state of the CMOS switch. Thus, by using the CMOS switch in the matching network, it is possible to vary matching dynamically during transmitting operation or during receiving operation. By using very fast CMOS switches, variation of the matching state during running operation is possible, since the CMOS switches can be switched so fast that no information transmitted via the matching network is lost during the switching process from the first switching state to the second switching state.

Further, the CMOS switch can be integrated mechanically into a matching network particularly unproblematically, since a CMOS switch typically has particularly small dimensions. Further, CMOS switches can be cheaply produced within integrated circuit technology. It is a further particular advantage when using a CMOS switch in a matching network that a CMOS switch can be controlled in a powerless way. In other words, in a static state of the CMOS switch, no control power is required for setting the switching state. Merely when switching between two switching states, a low control power has to be applied. Thus, a CMOS switch is particularly well suited for mobile applications, wherein minimization of the power consumption is of high importance.

Further, at least some embodiments of the inventive matching network causes significantly lower transmission losses than conventional matching networks. Thus, when using such a matching network, the requirement to convert reflected power into heat, or to dissipate the same, respectively, is omitted. By using the matching network with an impedance transformation circuit switchable by a CMOS switch, a conventionally used isolator becomes redundant. Saving an isolator is very advantageous, since the isolator has a significant transmission loss during the transmission in forward direction. Further, the isolator dissipates power flowing in backward direction at least partly.

By using the above-mentioned embodiments of the inventive matching network, it can be avoided by reducing or suppressing, respectively, reflection of a power, that a circuitry coupled to the matching network is brought into a non-linear operating point, for example by mismatching. If, for example, an output power amplifier is coupled to an antenna via the inventive matching network, the power reflected by the antenna is significantly reduced by the matching network in comparison to conventional circuitries. Thereby, the set operating point of the power amplifier is no altered, even when the antenna is subject to environmental conditions changing its base impedance. According to these embodiments, in that case by varying the switching state of the CMOS switch, the matching network can be quickly put into such a state, that the altered base impedance of the antenna is again sufficiently well matched. Thus, the power amplifier can be further operated at its set operating point, whereby the power amplifier typically shows optimum linearity.

Further, the described matching network allows using a single antenna for different frequency bands, without the requirement that the antenna is optimized for the different frequency bands. As a consequence, switching between two different matching states can be performed, by a simple variation of the switching state of the CMOS switch. Thus, best possible matching both in a first of several used frequency bands and in a second of several possible frequency bands can be obtained in response to the adjustment of the state of the CMOS switch.

Thus, it has been shown that at least some embodiments of an inventive matching network is ideally suited as quickly switchable dynamic matching network. The matching network can be advantageously used in connection with a single-band antenna, when the base impedance of the single-band antenna is varied by variation of the environmental conditions.

Further, the matching network allows multi-band operation with simple antennas.

In a further preferred embodiment, the impedance transformation circuit is implemented such that by switching the CMOS switch, an impedance transformation element can be selectively electrically separated from the impedance transformation circuit, electrically connected to the impedance transformation circuit, activated, deactivated, fully short-circuited or partly short-circuited. Thus, the CMOS switch can cooperate ideally with an impedance element, such as a resistor, an inductance, a capacitance or a transmission line.

In a preferred embodiment, the matching network comprises at least two input ports or at least two output ports. In this case, the matching network comprises a selection switch, which is implemented to select one port from the at least two input ports or the at least two output ports, and to couple the selected port with a signal path through the matching network. In this embodiment, the selection switch comprises at least one further CMOS switch, which is connected between an input port and an output port in a high-frequency path, such that the selection of the selected port depends on a switching state of the further CMOS switch. It has been shown that the usage of a CMOS switch is not only advantageous for setting the matching state, but also for selecting an input port of a plurality of input ports or an output port of a plurality of output ports, respectively. By using a CMOS switch for selecting an input port or an output port, respectively, a particularly fast and low-power controllable variation of the configuration of the high-frequency path becomes possible.

Thus, the usage of a CMOS switch for switching input ports of the matching network allows to selectively couple different transmitters with the same antenna. The switching, which of the transmitters is connected to the signal path through the matching network, can thereby be performed simultaneously with a variation of the matching state of the matching network, by using similar CMOS switches both for changing matching and for selecting an input port or output port, respectively.

In a further preferred embodiment, the matching network further comprises a control means, which is implemented to determine information, how good impedance matching at the input port of the matching network is, and which is further implemented to control the CMOS switch based on the information. In this implementation, the matching network is able to determine independently an unsatisfying impedance matching, and then to perform a reconfiguration of the impedance transformation circuit. Thus, at any time, best possible matching is ensured at the input port of the inventive matching network.

In a further preferred embodiment, the control means is implemented to set a plurality of states of the matching network by switching the CMOS switch, when the control means determines that the impedance matching at the input port is worse than a predetermined threshold. The control means is further implemented to determine further information for the plurality of states of the matching network, how good impedance matching is at the input port of the matching network for the plurality of states. Further, the control means is implemented to select a new state of the matching network based on the further information. Such an implementation of the control unit is particularly advantageous when the matching network comprises a plurality of CMOS switches, so that more than two matching states can be selected for the matching network. Thereby, it can be achieved that the control means identifies, for example, the best of several possible matching states of the matching network in that the control means sets the several matching states in a predetermined sequence and then determines how good the matching in the respective matching states actually is. Further, the control means can terminate the variation of the matching states, as soon as a matching state is identified, which is sufficiently good according to a predetermined threshold. The control means has the advantage that the CMOS switches, which allow setting of the matching state of the matching network, can switch very fast and above that wearless. Thus, the control means can set a plurality of states of the matching network in the shortest possible time and can determine how good the associated matching is.

Thus, the described implementation of the matching network using a control means allows dynamic matching of the matching state of the matching network to changing operating conditions. Thus, for example, the matching network is readapted when a base impedance of the antenna varies. Thus, at any time, sufficiently good or best possible antenna matching, respectively, is ensured, so that the power consumption of the respective transmitter and/or receiver, which comprises the inventive matching network, is minimized. At the same time, the transition of the power amplifier into a non-linear amplifying operation is counteracted.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
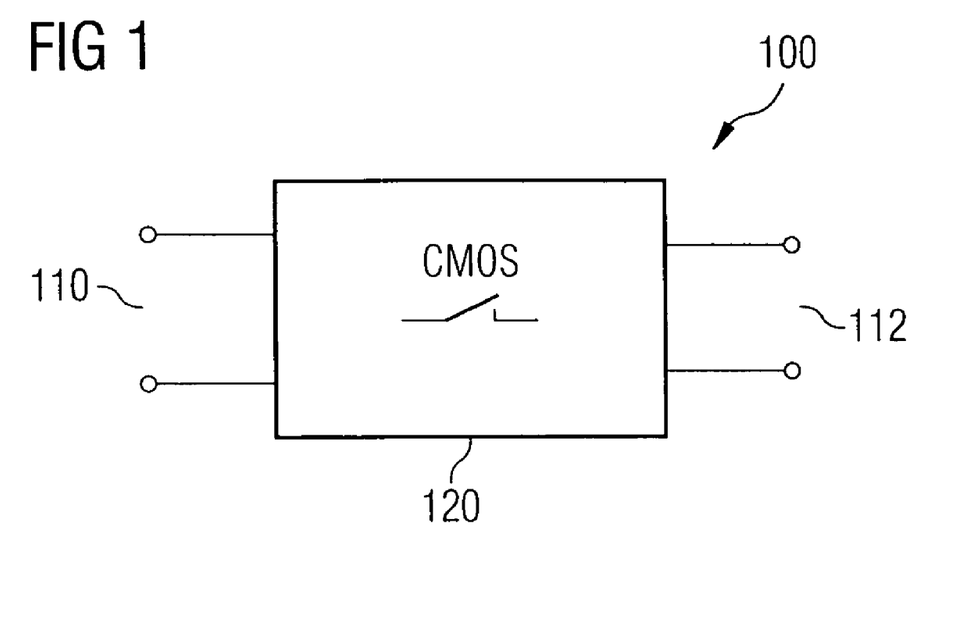
FIG. 1 is a schematic illustration of an inventive matching network according to a first embodiment of the present invention.

FIG. 1 shows a schematic illustration of an inventive matching network according to a first embodiment of the present invention. The matching network of FIG. 1 is designated by 100 in its entirety and has an input port 110 for receiving high-frequency power as well as an output port 112. The matching network comprises a switchable impedance transformation circuit 120, which is connected between the input port and the output port. In a high-frequency path, the impedance transformation circuit 120 comprises a CMOS switch, which has a first switching state and a second switching state. In the first switching state, for example, a CMOS switch is closed or low-resistively conductive, while in the second switching state, the CMOS switch is opened or high-resistive, respectively. The impedance transformation circuit 120 (also referred to as impedance transformation network) is further implemented to match a (given) first impedance applied to the output port on the input side to a first predetermined impedance in the first switching state, and to match a (given) second impedance applied to the output port on the input side to a second given impedance in the second switching state. In other words, the impedance transformation circuit can assume at least two different transformation states in dependence on the switching state of the CMOS switch, or the matching network can have two different matching states, respectively. In the at least two impedance transformation states, the impedance transformation circuit matches different impedances applied to the output terminal to a first given impedance and to a second given impedance. The first given impedance and the second given impedance can be, for example, the same impedance, for example a reference impedance of the input port.

Here, matching is defined in that a reflected power occurring at the input port is sufficiently small in relation to a power incoming at the input port 110. For example, it can be demanded that the reflected power applied to the input port 110 is at least 10 dB smaller than the power incoming into the impedance transformation circuit 120 at the input port 110. However, other thresholds than 10 dB can be used to define matching or a matched state, respectively.

Further, it should be noted that target impedances on the input side (the first given impedance and the second given impedance), to which the impedance transformation network 120 matches an impedance applied to the output port 112, can be different. This is advantageous when different circuitries with different output impedance can be selectively connected to the input port 110.

Further, it should be noted that the inventive matching network 100 can be, for example, coupled to the power amplifier with its input port 110. The output port 112 of the matching network 100 is preferably coupled to a (transmitting) antenna. Thus, a base impedance of the antenna can be adapted to an output impedance of the power amplifier by the matching network 100, so that a power reflected back to the power amplifier at the input port 110 is kept as low as possible. If the base impedance of the antenna connected to the output port 112 changes, for example, due to variations of the environment, can be changed by changing the switching state of the CMOS switch a matching state of the impedance transformation network 120, whereby again very quickly a sufficiently good matching can be obtained at the input port 110, even with varying base impedance of the antenna.

Further, the input port 110 of the matching network 120 can also be coupled to a (receiving) antenna, which receives high-frequency power and provides the same to the input port 110. In this case, preferably, an input part of a receiver is connected to the output port 112 of the matching network 100, which has a given input impedance. The impedance transformation network 120 can again be adjusted by appropriate switching of the CMOS switch that sufficiently good or optimum, respectively, matching exists between the (receiving) antenna and the input part, so that the high-frequency energy provided by the receiving antenna is used in a best possible way.

Figure 2A:
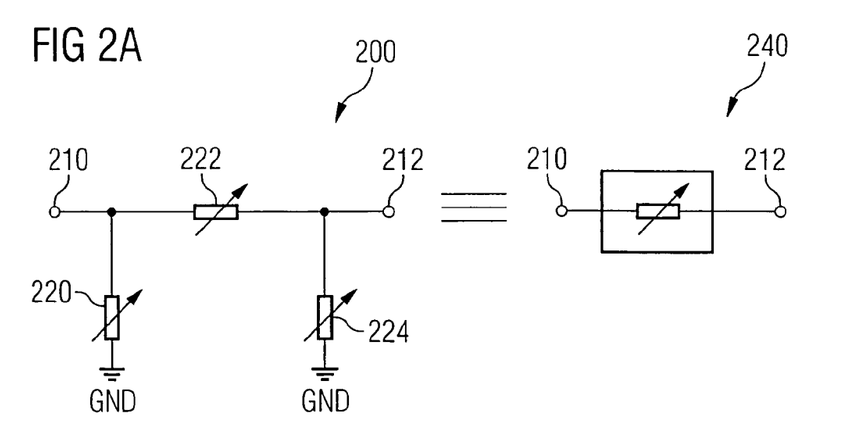
FIG. 2a is a circuit diagram of an inventive matching network according to a second embodiment of the present invention.

FIG. 2a shows a circuit diagram of the inventive matching network according to a second embodiment of the present invention. The matching network shown in FIG. 2a is designated by 200 in its entirety. The matching network 200 has a π switching configuration. The matching network 200 has an input port 210 as well as an output port 212. In the shown embodiment, the signals applied to the input port 210 and the output port 212 are related to a reference potential GND. In other words, the input port 210 and the output port 212 form unbalanced ports. A first adjustable impedance element 220 (also referred to as impedance transformation element or briefly element) is connected between the input port 210 (or a conductor of the input port, respectively) and the reference potential GND. A second adjustable impedance element 222 is connected between the input port 210 and the output port 212. A third adjustable impedance element 224 is further connected between the output port 212 (or a conductor of the output port, respectively) and the reference potential GND. Thus, the three adjustable impedance elements 220, 222, 224 form a π circuit, which is connected between the input port 210 and the output port 212.

The variable, normally low-loss adjustable impedance elements (also briefly referred to as elements) between the input port 210 and the output port 212 each have capacitive, inductive and/or ohmic characteristics, in dependence on which impedances are present at the input port 210 and the output port 212. For the adjustable impedance elements, preferably, reactive elements (inductances or capacitances, respectively) adjustable by CMOS switches are used to keep the losses in the matching network 120 as low as possible. However, the usage of resistive elements is sometimes practical, for example when particularly good matching or a particularly low reflection factor, respectively, is desired at the input port. Further, the adjustable impedance elements 220, 222, 224 can comprise (transmission) lines, which are implemented to realize the electric characteristics required to obtain matching.

In the shown illustration, the matching network 200 comprises three adjustable impedance elements. However, this is no compelling feature. Rather, for example only one of the three shown impedance elements 220, 222, 224 can be adjustable, while the other two impedance elements are fixed. At the same time, it is also possible that two of the impedance elements 220, 222, 224 are adjustable, while one impedance element is fixed or formed by a fixed impedance element, respectively.

Further, it should be noted that in deviation from the Collins circuit illustrated in FIG. 2a, for example gamma transformers and/or variable impedance elements connected in series and/or in parallel can be used to realize matching with the desired characteristics, for example with regard to bandwidth, transmission attenuation or impedance transformation.

The matching network shown in FIG. 2a forms a central part of the inventive dynamic matching network circuit.

Further, FIG. 2a shows a schematic illustration 240 of the dynamic matching network 200, as it can be used, for example, in a block diagram. Thus, in the following described embodiments, the schematic illustration 240 represents, for example, a matching network as shown in FIG. 2a.

Figure 2B:
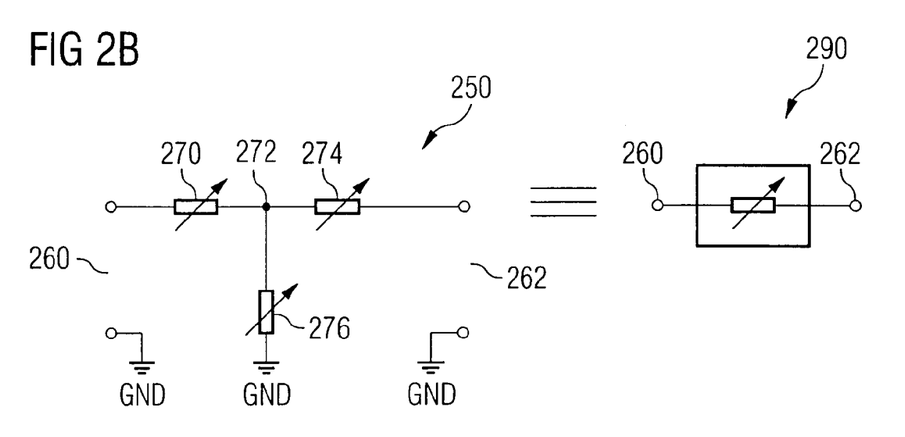
FIG. 2b is a circuit diagram of the inventive matching network according to a third embodiment of the present invention.

FIG. 2b shows further a circuit diagram of an inventive matching network according to a third embodiment of the present invention. The matching network of FIG. 2b is designated by 250 in its entirety. The matching network 250 has an input port 260 and an output port 262, which are here both exemplarily shown as unbalanced ports, with regard to a reference potential GND. An adjustable impedance element 270 is connected between a terminal of the input port 260 and a central node 272. A second adjustable impedance element 274 is further connected between the center node 272 and the terminal of the output port 262. Further, a third adjustable impedance element 276 is connected between the center node 274 and the reference potential GND. Thus, the three adjustable impedance elements 270, 274, 276 form a T circuit, which is connected between the input port 260, the output port 262 and the reference potential GND. The matching network 250 can also be described by a schematic illustration 290.

It should be noted that the theory required for the design of a fixed matching network in π circuit or T circuit can be taken, for example, from the known standard works on high-frequency technique. Further, a fixed, i.e. not dynamically adjustable matching network can also be determined by optimization in a switching simulator.

Figure 3A:
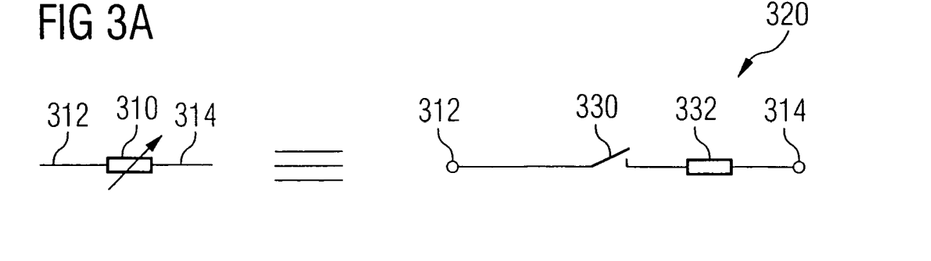
FIG. 3a is a circuit diagram of a first switchable impedance element for usage in an inventive matching network.

FIGS. 3a to 3d show circuit diagrams of adjustable or switchable, respectively, impedance elements for usage in an inventive matching network. Thus, the switchable impedance elements shown in FIGS. 3a to 3d form serial variable elements with two terminals. An adjustable impedance element, which is also designated by 310, can, for example, be formed by a series circuit 320 consisting of a CMOS switch 330 and an impedance element 332, for example as shown in FIG. 3a. In other words, a CMOS switch 330 and an impedance element 332 can be connected in series between a first terminal 312 and a second terminal 314. If the CMOS switch 330 is opened, the corresponding impedance element 310 forms an open circuit, apart from parasitic effects. If the CMOS switch 330 is closed, an impedance is applied between the terminals 312, 314, which is mainly determined by the impedance element 332. The impedance element 332 can be, for example, a resistor, a capacitance or an inductance. In the closed state of the CMOS switch 330, further, slight parasitic effects (ohmic resistance, parasitic inductance) of the CMOS switch 330 can influence the whole impedance present between the terminals 312 and 314. However, it is assumed that the parasitic effects caused by the CMOS switch 330 are small compared to the effect of the impedance element 332.

Figure 3B:
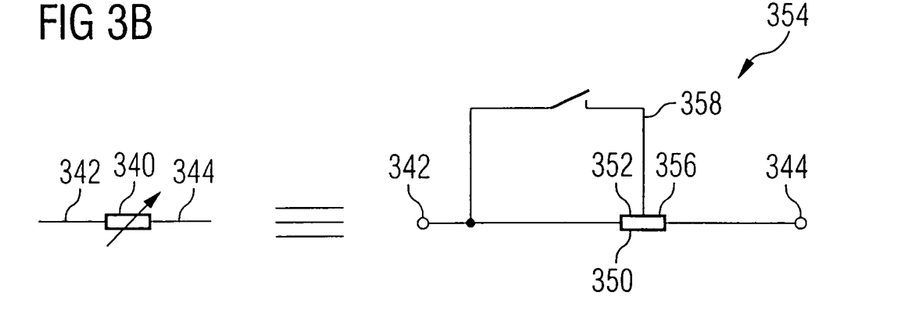
FIG. 3b is a circuit diagram of a second switchable impedance element for usage in an inventive matching network.

A variable impedance element 340 with two terminals 342, 344 can further be formed by an impedance element 350, where a first part 352 can be short-circuited by a CMOS switch 354. In other words, the impedance element 350 is connected in its entirety between the first terminal 342 and the second terminal 344. The impedance element 350 is overall formed by a first part 352 and a second part 356, and has further a tap 358. The first part 352 of the impedance element 350 lies thus between the first terminal 342 and tap 358. The second part of the impedance element 350 lies between the tap 358 and the second terminal 344. If the CMOS switch 354 is opened and thus high-resistive, both the first part 352 and the second part 356 of the impedance element 350 are effectively connected between the first terminal 342 and the second terminal 344. If, however, the CMOS switch 354 is closed, the first part 352 of the impedance element 350 is short-circuited. Thus, mainly only the second part 356 is effectively connected between the first terminal 342 and the second terminal 344. Thus, by opening and closing the CMOS switch 354, it can be determined whether the whole impedance element 350 or only the second part 356 of the impedance element 350 is effective.

The impedance element 350 can be, for example, a resistor or an inductance. Both resistors and inductances are available with a tap. If the impedance element 350 is, for example, an inductance, the same has a tap between the first end and its second end. If the CMOS switch 354 is closed, part of the inductance is short-circuited, and the adjustable impedance element has overall a smaller inductance value than in the case of an opened CMOS switch 354, where the whole inductance is effective. The like applies for the usage of a resistor. Although capacitances with tap are used more rarely than inductances or resistors with tap, a tap (for example an intermediate plate) can also be contacted in the capacitor in the way shown in FIG. 3b.

Figure 3C:
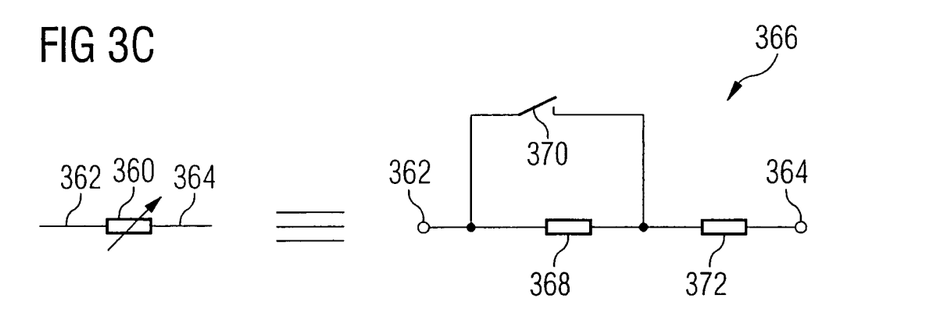
FIG. 3c is a circuit diagram of a third switchable impedance element for usage in an inventive matching network.

FIG. 3c shows a further embodiment of a switchable impedance element 360 with a first terminal 362 and a second terminal 364. A parallel circuit 360 consisting of a first impedance element 368 and a CMOS switch 370 and a second impedance element 372 are connected between the terminals 362, 364 in series. By the parallel circuit consisting of the first impedance element 368 and the CMOS switch 370, the first impedance element 368 can be selectively short-circuited by closing the CMOS switch 370. If, however, the CMOS switch 370 is opened, the first impedance element 368 is effective. Apart from parasitic effects, the impedance between the terminals 362, 364 of the shown switchable impedance element is determined by the sum of impedances of the first impedance element 368 and the second impedance element 372, when the CMOS switch 370 is opened. However, if the CMOS switch 370 is closed or conductive, respectively, the first impedance element 368 is mainly short-circuited, and the impedance of the second impedance element 372 is mainly effective between the terminals 362, 364, apart from parasitic effects.

The impedance elements 368, 372 can again be, depending on matching requirements, resistive, inductive and/or capacitive elements. Further, it should be noted that each of the impedance elements 368, 372 can be replaced by a fixed or switched arrangement of several impedance elements.

Figure 3D:
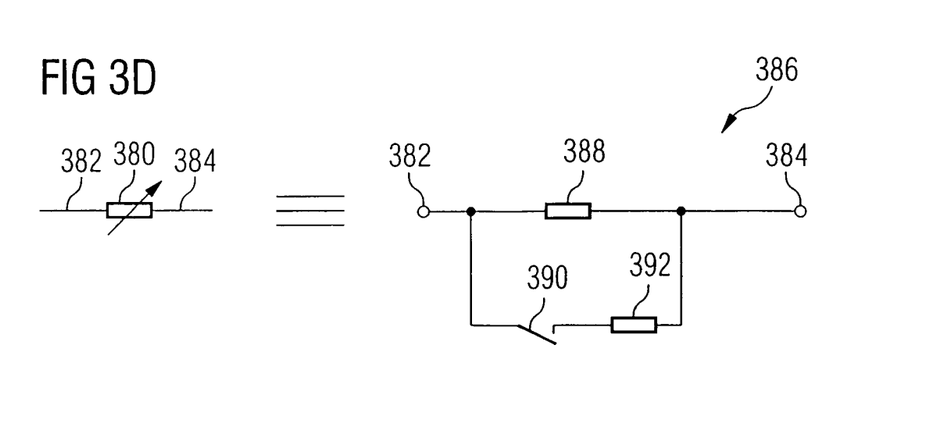
FIG. 3d is a circuit diagram of a fourth switchable impedance element for usage in an inventive matching network.

FIG. 3d shows a further realization of an adjustable impedance element 380 with two terminals 382, 384. A parallel circuit 386 is connected between the terminals 382, 384. A first branch of the parallel circuit 386 is formed by a first impedance element 388. A second branch of the parallel circuit 386 is formed by a series connection of a CMOS switch 390 and a second impedance element 392.

If the CMOS switch 390 is opened, mainly the impedance of the first impedance element 388 is effective between the terminals 382, 384. However, if the CMOS switch 390 is closed, mainly the impedance of the parallel circuit of the first impedance element 388 and the second impedance element 892 is effective between the terminals 382, 384.

The impedance elements 388, 392 can again comprise capacitances, inductances or resistors. Further, the impedance elements 388, 392 can consist of a combination of several individual devices (resistors, capacitors, inductances), like in the whole description. Further, the impedance elements 388, 392 can again be formed by a switched impedance element 310, 340, 360, 380.

Thus, the embodiments shown in FIGS. 3a to 3d describe different possibilities for realizing an adjustable impedance element 310, 340, 360, 380. Here, a CMOS switch 330, 354, 370, 390 that is assumed as ideal, can be switched between short circuit and open circuit, to vary the impedance of the switchable or adjustable impedance element, respectively. The respectively capacitive, inductive or ohmic impedance elements (also briefly referred to as elements) can thereby be

- selectively switched on or off (see impedance element 332 according to FIG. 3a),
- partly short-circuited to realize different discrete values (impedance element 350 according to FIG. 3b) (e.g. short circuiting of two turns of a coil with 5 turns)
- selectively connected in series to another impedance element (see impedance elements 368, 372 according to FIG. 3c), or
- selectively connected in parallel to another impedance element (see impedance elements 388, 392 according to FIG. 3d).

FIGS. 3a to 3d describe exemplarily the possibilities for realizing serial variable or switchable elements, respectively, between two terminals 312, 314; 342, 344; 362, 364; 382, 384 or between two ports, respectively. In other words, the impedance elements 310, 314, 360, 380 described in FIGS. 3a to 3d can be connected in series between an input port and an output port. If a terminal 312, 314; 342, 344; 362, 364; 382, 384 of the impedance elements 310, 314, 360, 380 is connected to a reference potential or a ground potential, respectively, variable elements connected in parallel can be realized from the described "serial" variable impedance elements. In other words, the impedance elements 310, 314, 360, 380 can be connected both serially between the input port and the output port in a signal path and also between a signal and a reference potential.

Figure 4:
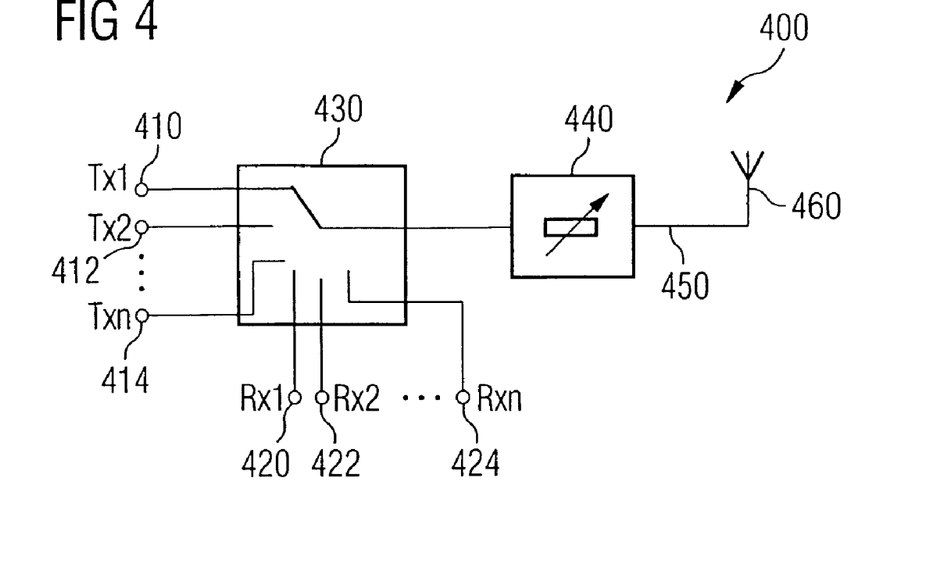
FIG. 4 is a circuit diagram of an inventive matching network with a selection switch according to a fourth embodiment of the present invention.

FIG. 4 shows a circuit diagram of an inventive matching network with a selection switch according to a fourth embodiment of the present invention. The matching network of FIG. 4 is designated by 400 in its entirety. The matching network 400 comprises a plurality of transmitter ports 410, 412, 414, which are also designated by Tx 1, Tx 2 and Tx n. Further, the matching network 400 comprises a plurality of receiver ports 420, 422, 424. The receiver ports are also designated by Rx 1, Rx 2 and Rx n. The transmitter ports 410, 412, 414 as well as the receiver ports 420, 422, 424 are further coupled to a selection switch 430. The selection switch 430 is implemented to selectively couple one of the transmitter ports 410, 412, 414 or receiver ports 420, 422, 424, respectively, to an impedance transformation circuit 440. Thus, the impedance transformation circuit 440 is connected between the selection switch 430 and an output port 450 of the matching network 400. The output port 400 is further implemented for the connection to an antenna 460.

The selection switch can alternatively be disposed directly at a port, which is implemented for connection of the antenna, so that the selection switch is connected between the antenna and the impedance transformation network.

Thus, FIG. 4 shows overall the structure of an antenna circuit with a dynamic matching network 440 with a switch 430 between receiving paths (Rx 1, Rx 2, Rx n) and transmission paths (Tx 1, Tx 2, Tx n). Here, the selection switch 430 is realized by a plurality of fast CMOS switches. The selection switch 430 allows to match several channels via the dynamic matching network 440 or the dynamic impedance transformation circuit 440, respectively. In other words, the selection switch 430 with fast CMOS switches can, for example, be used to allow a transmitting-receiving conversion in a high-frequency path of a transceiver front end. Thus, the antenna 460 can be selectively coupled to a transmitter or a receiver via the dynamic matching network 440 and the selection switch 430. Further, several transmitters for different frequency ranges can be present, which are coupled to the different transmitter ports 410, 412, 414. Further, several receivers can exist for different frequency ranges, which are coupled to the different receiver ports 420, 422, 424.

For the different frequency ranges, in which the different transmitters and/or receivers operate, typically, different matching is required, i.e. a different adjustment of the dynamically adjustable impedance transformation network 440. Further, in a transmitting and receiving operation, different adjustments of the dynamically adjustable impedance transformation network 440 can be required. Thus, it is preferred to control the selection switch 430 and the adjustable impedance transformation network 440 simultaneously or by a single control means, respectively. If the selection switch 430 is switched, at the same time the adjustment of the impedance transformation network 440 is changed. In other words, the adjustment of the selection switch 430 is coupled to the adjustment of the impedance transformation network.

Figure 5:
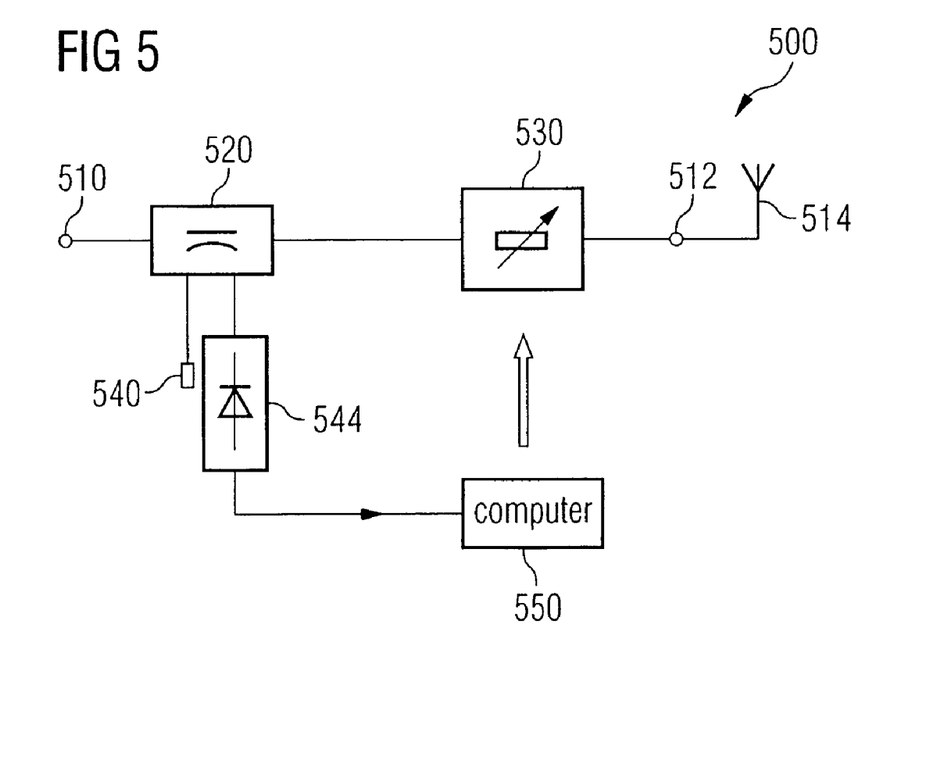
FIG. 5 is a circuit diagram of an inventive matching network with a control means according to a fifth embodiment of the present invention.

FIG. 5 shows a circuit diagram of an inventive matching network with a control means. The matching network of FIG. 1 is designated by 500 in its entirety. The matching network has an input port 510 as well as an output port 512, wherein the output port 512 is preferably coupled to the antenna 514. In a high-frequency signal path, a directional coupler 520 as well as an adjustable impedance transformation network 530 are connected in series between the input port 510 and the output port 512. The directional coupler 520 is implemented to determine a power incoming from the input port 510 to the impedance transformation network 530 and/or a power reflected by the impedance transformation network 530 to the input port 510. For that purpose, typically, a directional coupler 520 with three or four ports is used, wherein, for example, one of the four ports can be terminated with a terminating resistor or absorber 540, respectively. A power detector 544 is connected to a further port of the directional coupler 520, which comprises, for example, a diode for rectifying or a thermal power measurement means. Here, the power detector 544 can, for example, determine the power reflected by the impedance transformation network 530 to the input port 510, and pass respective information to a processing means 550. The processing means can just as well receive high-frequency power running from the input port to the impedance transformation network 530 or information about its amount, respectively.

Further, the processing means can alternatively or additionally receive information about a standing-wave ratio at the input port 510. Further, it is also possible that the processing means receives alternatively or additionally information about a complex-valued reflection factor occurring at the input of the impedance transformation network 530 connected to the input port 510.

Then, the processing means 550 evaluates the provided information about the forward and/or reflected power, the standing-wave ratio or the complex reflection factor and controls the CMOS switch in the adjustable impedance transformation network 530 corresponding to the applied information.

Thus, the processing means 550 can determine based on the received information, when the matching of the antenna 514 changes. The matching of the antenna can change, for example, when the environmental conditions of the antenna change, when, for example, an object is approaching the antenna. The processing means 550, which can also include a computer, is, for example, implemented to determine that a standing-wave ratio or an amount of an input reflection factor is outside a predetermined allowable or tolerable range, respectively. In response to this determination, the processing means 550 changes states of one or several CMOS switches in the adjustable impedance transformation network 530.

Here, it is preferred that the processing means 550 changes the switching states of the one or several CMOS switches in the adjustable impedance transformation network 530 for so long in a predetermined way until a measured reflected power, a measured standing-wave ratio or a measured reflection factor is again within the predetermined allowable range.

The sequence in which the switching states of CMOS switches are changed, can preferably be chosen independent of the measured reflected power, the measured standing-wave ratio or the measured input reflection factor. Such a process is enabled in that the CMOS switches can be switched extremely fast. Thus, a complex and computer-extensive evaluation of the measured reflected power, the measured standing-wave ratio or the measured input reflection factor, respectively, is not required. Rather, the processing means merely has to be able to detect when the respective measurement value lies within an allowable range.

In a further embodiment, the control means is implemented to adjust all switching states (or combinations of switching states, respectively) of the one or several CMOS switches included in the adjustable impedance transformation network 530 in response to detecting that the measured amount is outside a predetermined allowable range, and to determine the respectively associated measurement amount (reflected power, standing-wave ratio or input reflection factor) for every switching state or every combination of switching states, respectively.

In this embodiment, the control means 550 is implemented to determine that switching state or that combination of switching states, respectively, where the measured amount takes on a best possible value. Thus, the processing means 550 can be implemented to determine that switching state or matching state, respectively, of the adjustable impedance transformation network 530 and to adjust the same, where the lowest reflected power, the lowest standing-wave ratio or the lowest input reflection factor with regard to amount occurs.

Further, it should be noted that the processing means 550 can be implemented to adjust only combinations of switching states from a predetermined amount of allowable combinations of switching states instead of all possible switching states or combinations of switching states of the CMOS switches, respectively, in the adjustable impedance transformation network 530. Thereby, the predetermined amount of combinations of switching states can, for example, be a real subset of the overall amount of possible switching states, wherein the predetermined amount is preferably selected to describe matching states of the adjustable impedance transformation network 530, wherein an impedance occurring in the actual application at the output port 512 of the matching network is matched by the adjustable impedance transformation network 530.

The processing means 550 can further be implemented to receive information about the operating frequency and to use the same when adjusting the switching states of the CMOS switches of the adjustable impedance transformation network 530. Such a process is particularly advantageous when the matching network 500 is used for matching the antenna 514 in different frequency bands or frequency ranges, respectively.

Figure 6A:
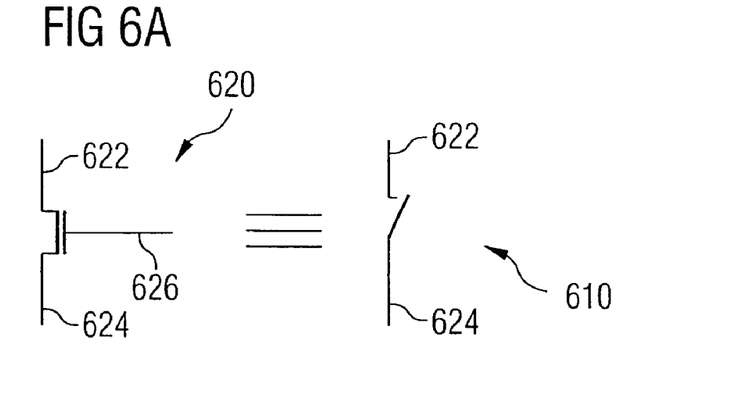
FIG. 6a is a circuit diagram of a first possible realization of a CMOS switch for usage in an inventive matching network.
Figure 6B:
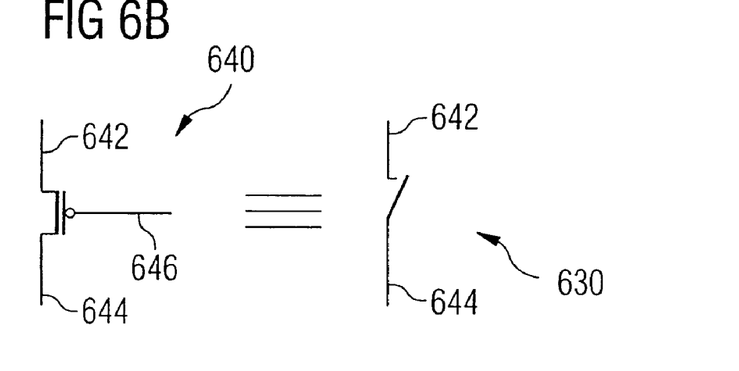
FIG. 6b is a circuit diagram of a second possible realization of a CMOS switch for usage in an inventive matching network.
Figure 6C:
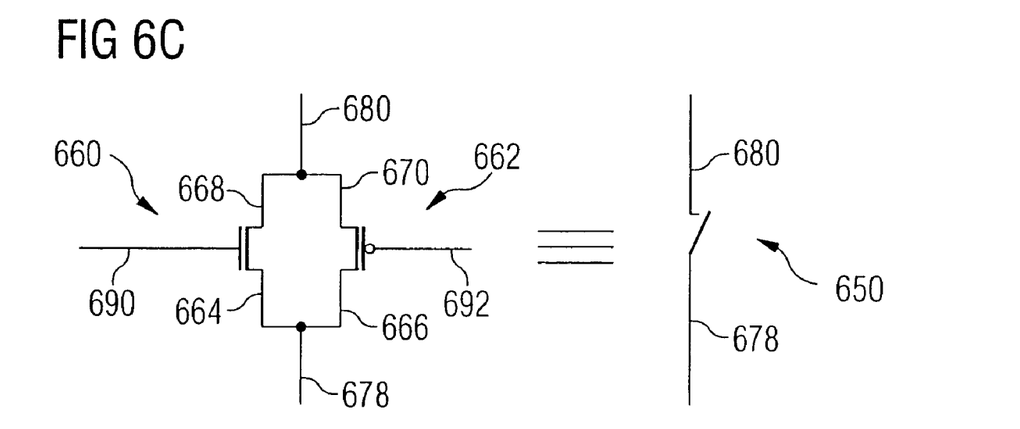
FIG. 6c is a circuit diagram of a third possible realization of a CMOS switch for usage in an inventive matching network.

FIGS. 6a to 6c show circuit diagrams of possible realizations of a CMOS switch for usage in an inventive matching network or in an inventive adjustable impedance transformation network, respectively.

FIG. 6a shows, for example, that a CMOS switch 610 can be formed by an n-channel MOS field effect transistor 620. A source-drain path between a source terminal of the n-channel MOS field effect transistor 620 and a drain terminal of the n-channel MOS field effect transistor 620 is thereby connected into a high-frequency path of the matching network or the impedance transformation network, respectively. A gate terminal 626 forms a control terminal, which can be used for determining a switching state of the CMOS switch 610. The adjustment of the switching state of the CMOS switch 610 is thereby performed by applying a fixed potential to the gate terminal 620 of the n-channel MOS field effect transistor.

FIG. 6b shows that a CMOS switch 630 can further be formed by a p-channel MOS field effect transistor 640 (short referred to as p-MOS field effect transistor). Thereby, a source terminal 642 corresponds to a first terminal of the CMOS switch 630, while a drain terminal 644 of the p-MOS field effect transistor 640 corresponds to a second terminal of the CMOS switch 630. Further, a gate terminal of the p-MOS field effect transistor 640 serves as control terminal for determining the switching state of the CMOS switch 630. Here, it has to be noted that a source drain path is connected between the source terminal 642 and the drain terminal 644 of the p-channel MOS field effect transistor 640 in a high-frequency path of the matching network or the impedance transformation network, respectively.

As shown in FIG. 6c, further, a CMOS transmission gate can be used as CMOS switch 650. Here, the CMOS transmission gate comprises a parallel circuit consisting of an n-channel MOS field effect transistor 660 and a p-channel MOS field effect transistor 662. Thereby, a source terminal 664 of the n-channel MOS field effect transistor 660 is coupled to a drain terminal 666 of the p-channel MOS field effect transistor 662, or connected in a directly conductive way, respectively, to form a first terminal 678 of the CMOS switch 650. Further, a drain terminal 668 of the n-channel MOS field effect transistor 660 is coupled to a source terminal 670 of the p channel MOS field effect transistor 662, or directly conductively connected to the same, to form a second terminal 680 of the CMOS switch 650.

A gate terminal 690 of the n-channel MOS field effect transistor 660 is controlled with a control signal, which is complementary to a signal applied to a gate terminal 692 of the p-channel MOS field effect transistor 662. If a high level is applied to the gate terminal 690 of the n-channel MOS field effect transistor 660, while a lower level is applied to the gate terminal 692 of the p-channel MOS field effect transistor 662, the transmission gate or the corresponding CMOS switch 650, respectively, is conductive. If the two transistors are controlled inversely, i.e. with a lower level at the gate terminal 690 and a high level at the gate terminal 692, the transmission gate is nonconductive, or the associate CMOS switch 650 is opened, respectively.

Here, it has to be noted that the switching state of the CMOS transistors is typically determined by a potential difference between the respective gate terminals and the associated source terminals. This means, for an appropriate control it is required to pull both the gate terminal and the source terminal to an appropriate potential with regard to direct current, in order to bring the respective MOS field effect transistor to a powered-on switching state or a powered-off switching state in dependence on a gate source potential difference or gate source voltage, respectively.

Figure 7:
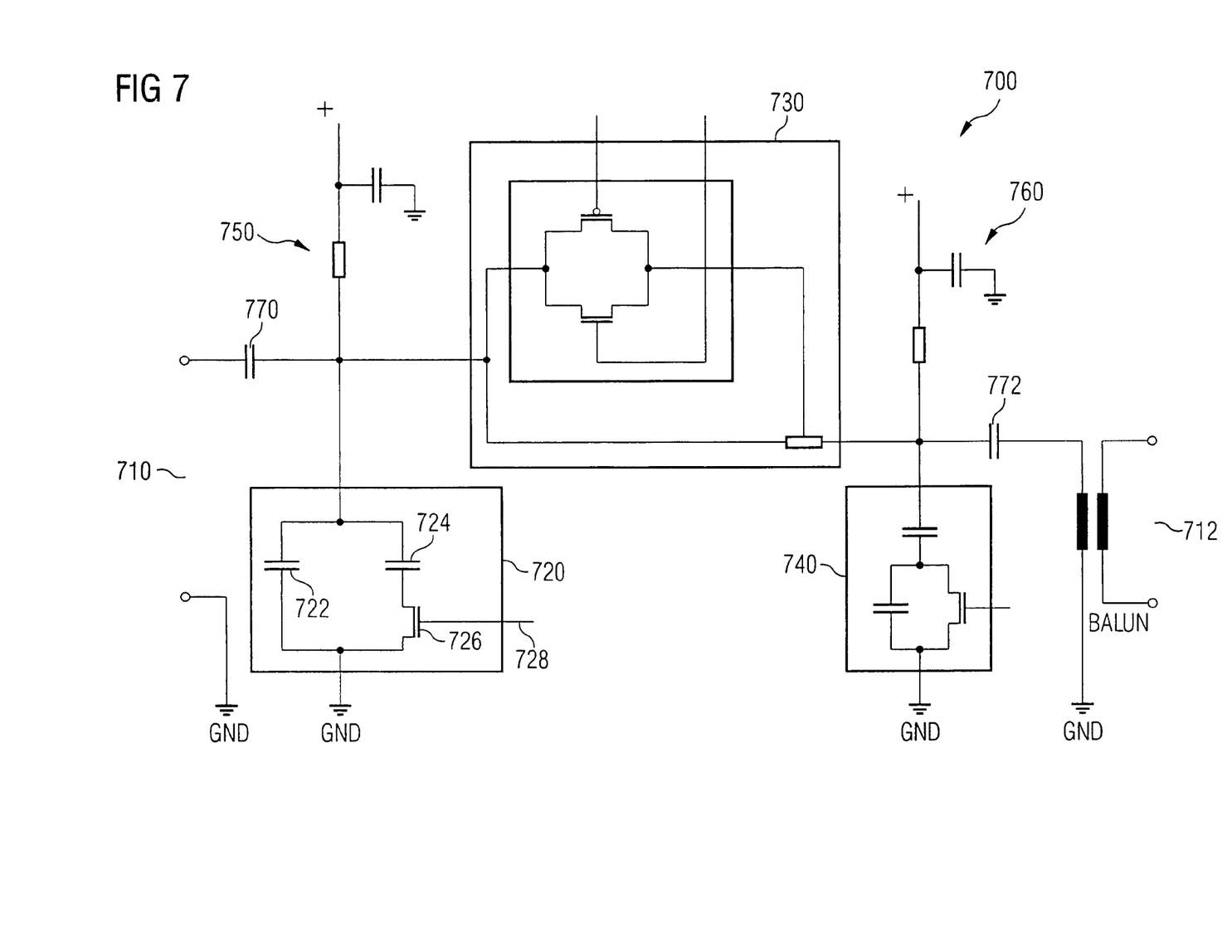
FIG. 7 is a detailed circuit diagram of an inventive matching network according to a sixth embodiment of the present invention.

FIG. 7 shows an exemplary circuit diagram of a matching network according to a seventh embodiment of the present invention. The circuitry of FIG. 7 is designated by 700 in its entirety. The matching network 700 has an unbalanced input port 710 as well as a balanced output port 712. The matching network 700 comprises a π circuit, which is connected between the input port 710 and the output port 712. According to its structure, a first adjustable impedance element 720 corresponds to the adjustable impedance element 380 shown in FIG. 3*d*. Two capacitances 722, 724 serve as fixed impedance elements, and an n-channel MOS field effect transistor 726 serves as CMOS switch. The control of the adjustable impedance element 720 is established via the gate terminal 728 of the n-channel MOS field effect transistor 726.

Further, the matching network 700 comprises a second adjustable impedance element 730, which corresponds to the adjustable impedance element 340 shown in FIG. 3*b* according to its structure. Here, a CMOS transmission gate according to FIG. 6*c* is shown as CMOS switch. A third adjustable impedance element 740 corresponds to the adjustable impedance element 360 shown in FIG. 3*c* according to its structure. Further, a first circuit 750 for operating point adjustment as well as a second circuit 760 for operating point adjustment are shown. Thus, for example, an operating point of the MOS transistors of the transmission gate included in the second impedance element 730 is adjusted by the first circuit 750 for operating point adjustment. In other words, a direct voltage is supplied to the source terminals or drain terminals of the MOS transistors, which ensures that the MOS transistors have switching behavior that is as good as possible. The direct voltage can be chosen, for example, such that an on-resistor of the corresponding MOS transistor or the corresponding MOS transistors, respectively, is as low as possible. Further, by selecting the operating point voltage, it can be achieved that a parasitic residual capacitance of the corresponding drain source path is as low as possible in the off-state of the MOS field effect transistors. Additional direct voltage separating capacitors 770, 772 can further ensure that a direct voltage is not passed on to the input port 710 or the output port 712, respectively.

The shown matching network 700 further comprises a balance transformer (also referred to as Balun), which is implemented to obtain that the signals applied to the output port 712 of the matching network 700 are balanced with regard to the reference potential GND. Thus, mode conversion is obtained through the balance transformer, by converting an unbalanced signal applied to the input of the balance transformer into a balance signal applied to the output of the balance transformer.

The shown circuitries can also be significantly altered. Thus, the input ports can be continuously selectively implemented as balanced or unbalanced ports. Also, the output ports can be selectively implemented in a balanced or unbalanced way. Mode conversion can be performed, for example, by a balance transformer or a every other network, which allows conversion of a balance signal into an unbalanced signal.

Instead of the shown concentrated circuit elements (capacitances, inductances and possibly resistors), distributed components realized by transmission lines can be used. Thereby, for example, a mixed design of concentrated and distributed elements is possible.

Further, instead of the MOS field effect transistors, arbitrary field effect transistors can be used, for example junction field effect transistors. The usage of field effect transistors using hetero structures is also possible. In the field of high-frequency technique, MESFETs can be used as switches. In other words, the described CMOS switches can be replaced by other switching means, provided that field effect transistors are used as switching elements.

In summary, it can be said that the present invention provides a dynamic matching network, which can be used for dynamic matching of antenna impedances for several frequency ranges due to very fast CMOS switches. Thereby, a single simple so-called "standard antenna" can be used in combination with the dynamic matching network, in order to replace a conventionally used multi-band antenna as well as a conventionally used isolator in different frequency ranges.

Thereby, multi-band systems can be operated with best possible antenna matching, which is required for linear and low-power transmission and receiving operation. With the help of switchable elements, a matching network is generated, which realizes a continuously matched antenna at different frequencies. Further, the dynamic matching network allows the compensation of environmental mismatchings of the antenna, so that an optimum and continuous antenna matching is ensured at the respective frequency.

Thus, by using the inventive matching network, extensive antenna development can be avoided. A simple wire is sufficient to fulfill the function of the standard antenna and to obtain an optimum and environmentally independent matching at any operating frequency. In multi-band devices, for example three-band mobiles with bluetooth, a single standard antenna can be used with the help of the inventive dynamic matching network to generate optimum matching dynamically in any used frequency band, and at the same time to compensate environmental mismatchings. In other words, the usage of an inventive dynamic matching network has a large number of advantages. With the dynamic matching network it is possible to obtain good matchings at different operating frequencies with a simple "standard antenna" or "base antenna". In the simplest case, the standard antenna can consist of a primitive piece of wire.

The dynamic antenna matching circuit can compensate environmental mismatchings at the antenna or the antennas, respectively. This leads to continuous optimum amplifier matching, whereby non-linearities and variations of the operating point are avoided. Thereby, the operating time of the unit is increased.

Conventionally used isolators are no longer required. The necessary space requirements and system weight of a unit with the inventive matching network is reduced. The production cost of a dynamic matching network circuit, which can be produced, for example, on a semiconductor substrate, is far below the ones for an isolator. At the same time, transmission losses are reduced, which increases the operating period of the accumulators.

Expensive antenna designs for different frequencies will become superfluous.

Several frequencies can be operated with a single antenna. Here, for example in multi-band devices, the base impedance of the standard antenna is optimally adapted at the respective operating frequency with the help of the dynamic matching network. By using the inventive matching network, it is no longer required to integrate several antennas for different used frequency ranges in the device.

In contrast to known conventional approaches, several different frequency bands can be matched dynamically with the presented matching network. The resulting space, weight and cost savings do not have to be sacrificed again at another location, so that the resulting savings are significantly higher. Above that, mismatchings are compensated at the antenna, so that thereby no transmission power is lost.

In summary, it can be said that the present invention provides a dynamic matching network, such as it was described for example with regard to FIGS. 2a and 2b. The corresponding dynamic matching network, which can also be considered as adjustable impedance transformation network, is also described by an equivalent circuit diagram as shown in FIGS. 2a and 2b (see reference numbers 240, 290). Further, different possibilities for realizing variable impedance elements in serial or parallel connection have been shown with regard to FIGS. 3a to 3d. Thus, FIG. 3a describes switching on or off, respectively, of elements, FIG. 3b short-circuiting of areas of elements, FIG. 3c short-circuiting of elements and FIG. 3d connecting in parallel of elements. The switching on or off, respectively, the short-circuiting and the selective connecting in parallel is performed with the help of CMOS switches, whose structure has been shown exemplarily with regard to FIGS. 6a to 6c.

Further, with regard to FIG. 4, the structure of a dynamic matching network with control electronics has been described. A control is used for completing the dynamic matching network circuit. Here, part of the transmission power is passed to the processing circuit or calculating unit 550, respectively, via the coupler or directional coupler 520, respectively. The processing circuit or calculating unit 550 controls the CMOS switches in the adjustable impedance transformation network 530 and realizes thus antenna matching in dependence on the present antenna impedance. Further, based on FIG. 4, the structure of an antenna circuit with a dynamic matching network and a switch between receiving paths (Rx) and transmission paths (Tx) has been described.

Generally, it can be said that the present invention provides an architecture of a circuitry with two ports for dynamic impedance matching between an input port and an output port. The ports (input port or output port, respectively) can have balanced or unbalanced terminals. The elements of the matching network can each have ohmic, inductive and/or capacitive characteristics or can also be implemented as lines. A transformation or impedance transformation, respectively, of the matching network is brought to different discrete values by switching fast CMOS switches. The matching network itself consists of an arbitrary arrangement of variable or adjustable (impedance) elements connected in series or in parallel. The impedance matching can thereby be implemented for any operating frequency, wherein the operating frequency can change during the operation. Further, the impedance matching takes place simultaneously for more than one frequency.

When extending the above architecture of the circuitries, the input port is implemented in a balanced or unbalanced line system. Also, the output port is implemented in an unbalanced or balanced line system. The required mode conversion is realized by the matching network. Further, by the selection of the switchable elements, a switch functionality is realized, and the switchable elements can further be used for generating selected electric characteristics, such as filtering, phase shift or impedance transformation.

Additionally, it is preferred that the architecture of the circuitries is implemented such that a simple antenna can be attached to the output port of the matching network.

Further, it should be noted that the field of application of the inventive matching network is far beyond the field of mobile communication. In combination with the newly available very fast CMOS switches, according to the invention, a matching network can be realized which allows dynamic matchings for fast applications in the gigahertz range. Here, matching networks can also be generated for terminals with any fast changing impedances. The inventive matching network can, for example, be used in connection with a plasma ignition, in order to match the occurring, quickly changing impedance always sufficiently well.

Due to its variable impedances, the inventive matching network can also be used as simple switch in fast digital circuits. Thereby, no standing waves occur by the variably adjustable load impedance. Further, two matching networks can be used to allow duplex operation. Above that, it is possible to use a combination of matching networks to realize dynamic matchings in multi-mode systems.

Thus, the present invention provides a dynamically adjustable matching network which can, for example, be used to allow a continuously sufficiently well-matched linear and power-efficient operation of a transmitting amplifier connected to the antenna via the matching network with quickly changing antenna base impedance. However, a plurality of further fields of application results for the inventive matching network. The inventive advantages are only enabled by the usage of fast CMOS switches in a high-frequency signal path of the inventive matching network.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A matching network for matching an antenna to a transmitter or receiver, comprising:
an input port for receiving high-frequency power;
an output port;

a switchable impedance transformation circuit connected between the input port and the output port, wherein the impedance transformation circuit comprises a CMOS switch in a high-frequency path having a first switching state and a second switching state, wherein the impedance transformation circuit is implemented to match a first impedance applied to the output port to a first predetermined impedance in the first switching state, and to match a second impedance applied to the output port to a second predetermined impedance in the second switching state, wherein the CMOS switch comprises a parallel circuit consisting of an n-channel MOS field effect transistor and a p-channel MOS field effect transistor, wherein a source terminal of the n-channel MOS field effect transistor is coupled to a drain terminal of the p-channel MOS field effect transistor to form a first terminal of the CMOS switch, wherein a drain terminal of the n-channel MOS field effect transistor is coupled to a source terminal of the p channel MOS field effect transistor to form a second terminal of the CMOS switch, wherein the n-channel MOS field effect transistor comprises a gate terminal for a first control signal, and wherein the p-channel MOS field effect transistor comprises a gate terminal for a second control signal complementary to the first control signal.

2. The matching network according to claim 1, wherein the impedance transformation circuit is implemented such that switching the CMOS switch selectively effects separating an impedance element from the impedance transformation circuit, connecting the impedance element to the impedance transformation circuit, activating the impedance element, deactivating the impedance element, fully short-circuiting the impedance element or partly short-circuiting the impedance element.

3. The matching network according to claim 1, wherein the impedance transformation circuit in a high-frequency path comprises a series connection of the CMOS switch and an impedance element, wherein the series connection is implemented such that a high-frequency current flow through the impedance element is possible in the first switching state, and that a current flow through the impedance element is interrupted in the second switching state of the CMOS switch.

4. The matching network according to claim 1, wherein the impedance transformation circuit in a high-frequency path comprises an impedance element, which is coupled to the CMOS switch, such that part of the impedance element can be selectively short-circuited in dependence on a switching state of the CMOS switch.

5. The matching network according to claim 1, wherein the impedance transformation circuit in a high-frequency path comprises a parallel connection of the CMOS switch and an impedance element, wherein the parallel connection is implemented such that the impedance element can be selectively short-circuited in dependence on the switching state of the CMOS switch.

6. The matching network according to claim 1, wherein the impedance transformation circuit in a high-frequency path comprises a parallel connection consisting of a first impedance element and a series connection of a second impedance element and the CMOS switch, wherein the parallel connection is implemented such that the second impedance element can be selectively connected in parallel to the first impedance element, in dependence on a switching state of the CMOS switch.

7. The matching network according to claim 1, wherein the input port is unbalanced in relation to a reference potential, and wherein the output port is balanced in relation to the reference potential.

8. The matching network according to claim 1, wherein the input port is balanced in relation to a reference potentials, and wherein the output port is unbalanced in relation to the reference potential.

9. The matching network according to claim 7, wherein the matching network is implemented to obtain mode conversion between a high-frequency signal balanced in relation to the reference potential and a high-frequency signal unbalanced in relation to the reference potential.

10. The matching network according to claim 1, wherein the matching network comprises at least two input ports or at least two output ports, and wherein the matching network comprises a selection switch, which is implemented to select one port from the at least two input ports or the at least two output ports, and to establish a high-frequency signal path through the matching network comprising the selected port, wherein the selection switch comprises at least one further CMOS switch, which is connected between an input port and an output port in the high-frequency signal path, such that the selection of the selected port depends on a switching state of the further CMOS switch.

11. The matching network according to claim 1, wherein the matching network is implemented such that a circuitry switched by the CMOS switch, which is part of the matching network, effects a phase shift depending on the switching state of the CMOS switch.

12. The matching network according to claim 1, wherein the matching network is implemented such that a circuitry switched by the CMOS switch, which is part of the matching network, effects filtering depending on the switching state of the CMOS switch.

13. The matching network according to claim 1, wherein the matching network is implemented to be connected to an antenna, the input impedance of which varies in amount by more than 50% across an operating frequency range.

14. The matching network according to claim 1, wherein the matching network comprises a controller, which is implemented to determine information how good impedance matching at the input port of the matching network is, and to control the at least one CMOS switch based on that information.

15. A matching network for matching an antenna to a transmitter or receiver, comprising:

an input port for receiving high-frequency power;

an output port;

a switchable impedance transformation circuit connected between the input port and the output port, wherein the impedance transformation circuit comprises a CMOS switch in a high-frequency path having a first switching state and a second switching state, wherein the impedance transformation circuit is implemented to match a first impedance applied to the output port to a first predetermined impedance in the first switching state, and to match a second impedance applied to the output port to a second predetermined impedance in the second switching state, wherein the input port is unbalanced in relation to a reference potential, and wherein the output port is balanced in relation to the reference potential, and wherein the matching network is implemented to obtain mode conversion between a high-frequency signal balanced in relation to the reference potential and a high-frequency signal unbalanced in relation to the reference potential.

16. A matching network for matching an antenna to a transmitter or receiver, comprising:
    an input port for receiving high-frequency power;
    an output port;
    a switchable impedance transformation circuit connected between the input port and the output port,
    wherein the impedance transformation circuit comprises a CMOS switch in a high-frequency path having a first switching state and a second switching state,
    wherein the impedance transformation circuit is implemented to match a first impedance applied to the output port to a first predetermined impedance in the first switching state, and to match a second impedance applied to the output port to a second predetermined impedance in the second switching state,
    wherein the matching network comprises a controller which is implemented to determine information how good impedance matching at the input port of the matching network is, and to control the at least one CMOS switch based on that information, and
    wherein the controller is implemented to adjust a plurality of matching states of the matching network by switching the at least one CMOS switch, when the controller determines that the impedance matching at the input port is below a predetermined threshold, to determine further information for the plurality of matching states of the matching network, how good impedance matching to the input port of the matching network is, and to select and adjust a new matching state of the matching network based on the further information.

* * * * *